United States Patent [19]

Moench

[11] 4,194,130
[45] Mar. 18, 1980

[54] DIGITAL PREDECODING SYSTEM

[75] Inventor: Jerry D. Moench, Austin, Tex.

[73] Assignee: Motorola, Inc., Schaumburg, Ill.

[21] Appl. No.: 853,786

[22] Filed: Nov. 21, 1977

[51] Int. Cl.² .................... H03K 19/08; H03K 19/20; G11C 8/00

[52] U.S. Cl. .................... 307/205; 307/207; 307/270; 307/DIG. 5; 365/230

[58] Field of Search ............... 307/205, 207, 215, 218, 307/270, DIG. 1, DIG. 5; 365/230, 231

[56] References Cited

U.S. PATENT DOCUMENTS

| | | | |
|---|---|---|---|
| 3,611,437 | 10/1971 | Varadi et al. | 307/DIG. 5 X |
| 3,685,027 | 8/1972 | Allen | 307/DIG. 5 X |
| 3,691,534 | 9/1972 | Varadi et al. | 307/DIG. 5 X |
| 3,778,784 | 12/1973 | Karp et al. | 307/DIG. 5 X |
| 3,900,837 | 8/1975 | Hunter | 307/DIG. 5 X |
| 3,940,747 | 2/1976 | Kuo et al. | 307/DIG. 5 X |
| 3,962,686 | 6/1976 | Matsue et al. | 307/DIG. 5 X |
| 4,027,174 | 5/1977 | Ogata | 307/205 |
| 4,042,915 | 8/1977 | Reed | 307/DIG. 5 X |
| 4,104,735 | 8/1978 | Hoffmann et al. | 307/DIG. 5 X |

OTHER PUBLICATIONS

Radzik, "Multiple Image Read-Only Storage"; *IBM Tech. Discl. Bull.*; vol. 14, No. 12, pp. 3737-3738; 5/1972.

*Primary Examiner*—Larry N. Anagnos
*Attorney, Agent, or Firm*—Joe E. Barbee

[57] ABSTRACT

A digital memory array address predecoder is provided in combination with an address decoder. The predecoder permits a reduction in the number of transistors used in the decoder thereby maximizing the utilization of silicon area of an integrated circuit memory. This invention has particular application to a MOS integrated circuit decoder.

6 Claims, 2 Drawing Figures

1

DIGITAL PREDECODING SYSTEM

BACKGROUND OF THE INVENTION

This invention relates, in general, to digital decoding systems and more particularly, to a metal oxide semiconductor (MOS) integrated circuit address decoder.

An integrated circuit memory such as a 16K RAM memory, for example, will have at least 128 rows and 128 columns of cells which must be selected by the address decoders. NOR gates are normally used to achieve such decoding. However, as many as seven inputs may be required for such a NOR gate. The rows and columns of storage cells of the memory are very closely packed together and one NOR gate is required for each row of storage cells to be selected. Consequently, the NOR gates must be no wider, in terms of chip area, than a row or column of cells. It would be very desirable if fewer than six to seven input transistors were required for each NOR gate. There is ordinarily quite a bit of wasted space in the layout of a memory chip in that portion of the chip in which the address inverters or address buffers are located. By now, it should be appreciated that it would be desirable to reduce the number of inputs to the NOR gates and to better utilize the wasted space in the layout of a memory chip.

U.S. Pat. No. 4,027,174 which issued to Yoshihiro Ogata is a good example of the prior art address decoder NOR gates. U.S. Pat. No. 4,027,174 illustrates the large number of inputs required for the address decoder NOR gate. Since this decoder must be squeezed in between the rows and columns of the storage cells it can be seen that sometimes the size of the transistors in the NOR gate must be decreased which also tends to decrease the operating speed of the NOR gate.

Accordingly, it is an object of the present invention to provide an improved circuit for decoding address signals to a memory array.

Another object of the present invention is to reduce the capacitance load seen by the address buffers.

Yet another object of the present invention is to make maximum utilization of silicon space surrounding an IC memory.

A further object of the present invention is to provide predecode addressing for an integrated circuit address decoder.

SUMMARY OF THE INVENTION

In carrying out the above and other objects of the invention in one form, there is provided an improved address decoding system which reduces the size of the address decoder NOR gates and yet improves the operating speed of an address decoder for a memory array. More specifically an OR gate is used as an address predecoder to reduce the number of input transistors required for a NOR gate in an address decoder. Better utilization of the space surrounding a memory array is permitted by the present invention.

The subject matter which is regarded as the invention is set forth in the appended claims. The invention itself, however, together with further objects and advantages thereof, may be better understood by referring to the following detailed description taken in conjunction with the accompanying drawings.

The exemplification set out herein illustrates the preferred embodiment of the invention in one form thereof, and such exemplification is not to be construed as limiting in any manner.

DESCRIPTION OF THE PREFERRED EMBODIMENTS

Figure 1:
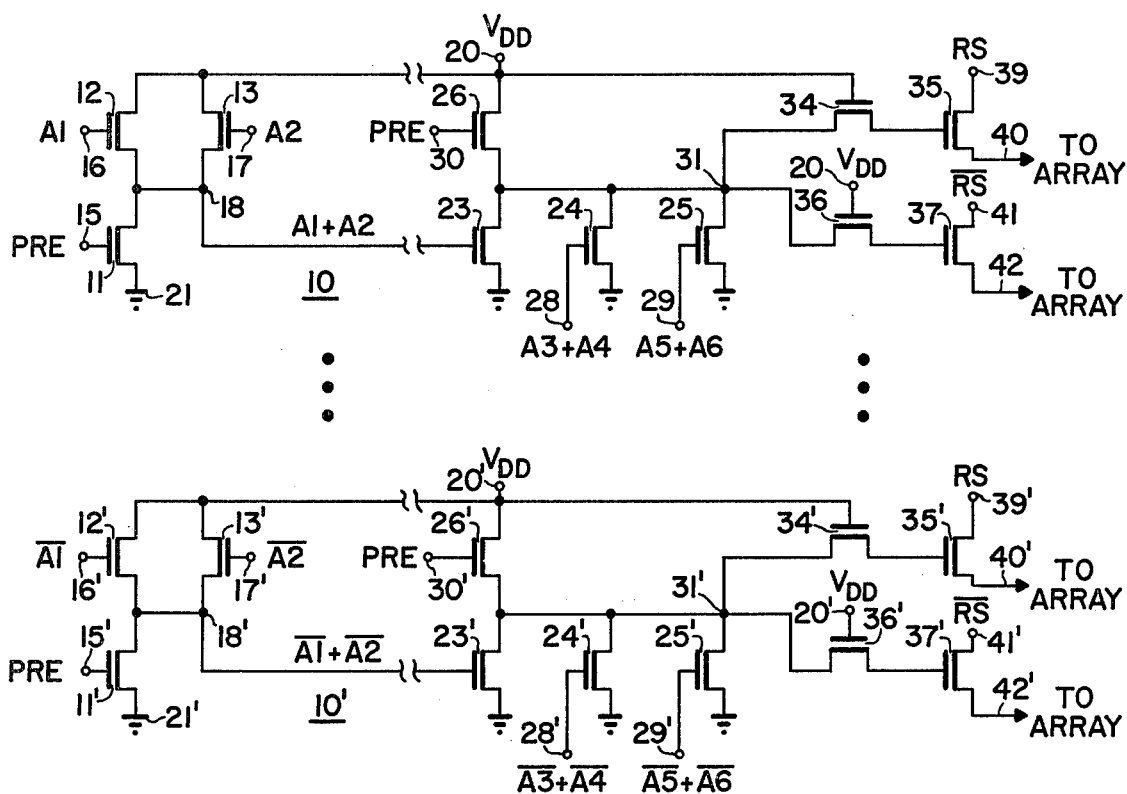
FIG. 1 illustrates in schematic form one embodiment of the invention.

The digital decoding system 10 illustrated in FIG. 1 provides a circuit for achieving the NOR decoding function with a reduced number of input transistors by providing stages of predecode addressing. The circuit illustrated in FIG. 1 permits filling in some of the wasted space on an IC memory chip with predecode addressing circuitry and thereby eliminating some of the NOR gate input transistors. Even though the total number of digital signal decoding transistors may not be reduced, the NOR gates themselves are smaller since they have fewer transistors and can therefore be more easily packed into the required chip area which would otherwise not be efficiently utilized. As an example, in a 16K memory that has the same number of rows as columns, e.g. 128, would require 64 NOR gates for the rows and 64 NOR gates for the columns. By using the circuit shown in FIG. 1, three input transistors are eliminated from each NOR gate thereby providing a total reduction of 384 transistors from the NOR gates of such a 16K memory.

As illustrated in FIG. 1, a NOR gate, as used in the present invention, includes field effect transistors 23, 24, 25, and 26. The OR gate used to reduce the number of transistors in the NOR gates used in the past includes field effect transistors 11, 12, and 13. The number of digital signals or address signals to be decoded for a 16K memory having 128 rows would normally include 7 address signals. The circuits illustrated in FIG. 1 are just two of 64 required circuits for such a 16K memory. As shown in FIG. 1, two addresses are ORed by the OR gate and this ORed output is coupled to the NOR gate where it is NORed with the other addresses. The top circuit in FIG. 1 ORs coded addresses A1 and A2 and then NORs these with A3+A4 and A5+A6. The bottom circuit in FIG. 1 ORs $\overline{A1}$ and $\overline{A2}$ and then NORs these with $\overline{A3}+\overline{A4}$ and $\overline{A5}+\overline{A6}$. The dots between the top and bottom circuit indicates other circuits (which are not shown) are used to predecode and decode the rest of the inputs necessary to obtain signals for 128 rows of cells. The lower circuit in FIG. 1 uses primed reference numerals and operates identically to the upper or top circuit whose operation will be explained hereinafter.

Transistor 12 has a gate electrode connected to terminal 16 which receives one of the coded address signals such as A1. Transistor 13 also has a gate electrode which is connected to terminal 17 and receives another one of the address signals such as A2. A first electrode of transistors 12 and 13 is connected to terminal 20 which is a power supply terminal having a voltage $V_{DD}$ applied to it. Transistors 12 and 13 have second electrodes which are connected to node 18. Node 18 is also connected to a first electrode of transistor 11. A second electrode of transistor 11 is connected to a ground reference 21 which is the return terminal for the power supply providing voltage $V_{DD}$. Transistor 11 has a gate electrode connected to terminal 15. A precharge signal, PRE, is applied to terminal 15 which forward biases pull down transistor 11 thereby discharging any potential appearing at node 18. If an address signal appears at terminal 16 or 17 then node 18 rises towards voltage $V_{DD}$. Node 18 serves as an output node for the OR gate formed by transistors 11, 12 and 13. The address signals appearing at terminals 16 and 17 are ORed together at node 18 (A1+A2) and connected to a gate electrode of transistor 23. Additional transistors can be added in parallel with transistor 23 to provide for handling additional addresses such as shown by transistors 24 and 25. As an example, transistor 24 has a gate electrode connected to terminal 28 which receives ORed addresses A3 and A4. Transistor 25 has its gate electrode connected to terminal 29 which receives ORed addresses A5 and A6. Transistors 23, 24, and 25 have their first electrodes connected to output node 31 while their second electrodes are connected to ground. Transistor 26 is connected between output node 31 and voltage terminal 20. Transistor 26 has a gate electrode connected to terminal 30 which also receives the precharge signal PRE. When a precharge signal is present at terminal 30 node 31 is allowed to rise toward the voltage $V_{DD}$. An input on the gate electrode of transistor 23, 24, or 25 will cause the transistor to conduct thereby discharging any voltage appearing at node 31.

Transistors 34 and 36 are connected to the NOR gate output node 31. Transistor 34 serves to couple any voltage at node 31 to the gate electrode of transistor 35. Transistor 35 has a first electrode connected to terminal 39 which receives a derived row select signal RS. A second electrode of transistor 35 is connected to line 40 which goes to the memory array. Transistor 36 serves to couple the voltage from node 31 to a gate electrode of transistor 37. Transistor 37 has a first electrode connected to terminal 41 which receives $\overline{RS}$. A second electrode of transistor 37 is connected to line 42 which goes to a column or row of the memory array. Transistors 35 and 37 provide a logic ANDing function of the signal at node 31 with RS and $\overline{RS}$, respectively. Signal RS is derived by ANDing a row select signal with the seventh coded address (AO), and signal $\overline{RS}$ is derived by ANDing the row select signal with the complement of the seventh coded address ($\overline{AO}$). This derivation is not shown since only RS and $\overline{RS}$ are needed for an understanding of the invention. As will be understood by those persons skilled in the art, seven addresses are needed to describe 128 locations in a memory. By using the seventh address signal to derive RS and $\overline{RS}$ then only 64 NOR gates are required instead of 128. Transistors 34 and 36 have their gate electrodes connected to voltage $V_{DD}$ and provide isolation between node 31 and transistors 35 and 37, respectively, which reduces capacitance at the gate electrodes of transistors 35 and 37 which helps bootstrapping of those nodes.

Figure 2:
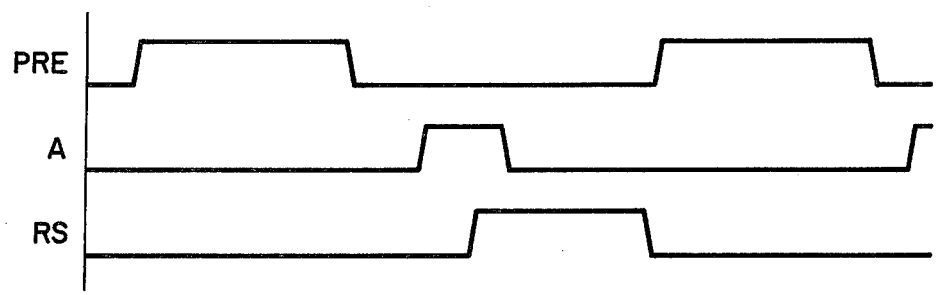
FIG. 2 is a timing diagram representative of the signals associated with the circuit of FIG. 1 and may be useful in understanding the operation of the circuit of FIG. 1.

As can be seen in FIG. 2, the precharge signal designated as PRE occurs before the address signals indicated by waveform A. Waveform A is representative of the time slot that would be occupied by the coded address signals. Waveform RS occurs before the termination of the address signal, A, and continues for a period of time after the address signal returns to zero. Where one address signal is used to derive row select signal RS then, of course, waveform, A, is only representative of the remainder of the address signals. When precharge signal PRE is applied to terminals 15 and 30 node 18 is discharged and node 31 is charged, respectively. Then if one or both of the addresses is present at terminals 16 or 17, node 18 will go high. Transistor 23 becomes conductive by the high on node 18 thereby discharging node 31. In addition, node 31 can be discharged by either transistor 24 or 25 being conductive. If none of the input addresses are present in a high state then node 31 is not discharged. This is true for the addresses at terminals 16, 17, 28 and 29. Of course, if addresses at terminals 16 and 17 are not in a high state then node 18 remains discharged.

By now it should be appreciated that there has been provided an address predecoder which serves to decrease the size of an address decoder NOR gate circuitry but yet does not increase the number of metal (poly or diffusion) lines required for the decoder. The circuit illustrated in FIG. 1 can be used for more or less addresses than those illustrated. The circuit of FIG. 1 results in a lower capacitance load which would normally be seen by the address buffers which would be connected to terminals such as 16 and 17 thereby improving the overall operating speed of the decoding function.

By way of example only the following is a list of the transistor sizes in microns that can be used in one embodiment of the digital decoding system 10:

| Field Effect Transistors | Microns |
|---|---|
| 11 | 100/6 |
| 12 | 200/6 |
| 13 | 200/6 |
| 23 | 35/6 |
| 24 | 35/6 |
| 25 | 35/6 |
| 26 | 25/6 |
| 34 | 15/7 |
| 35 | 40/6 |
| 36 | 15/7 |
| 37 | 40/6 |

Consequently, while in accordance with the Patent Statutes, there has been described what at present are considered to be the preferred form of the invention it will be obvious to those skilled in the art that numerous changes and modifications may be made herein without departing from the true spirit and scope of the invention, and it is therefore aimed in the following claims to cover all such modifications.

What is claimed as new and desired to secure by Letters Patent of the United States is:

1. A circuit for providing address signals to a memory array, comprising: a plurality of OR gates for predecoding a first portion of an address signal received in a coded format; a plurality of NOR gates each coupled to a respective one of the plurality of OR gates, the plurality of NOR gates providing at least one output; and a plurality of means each coupled to one of the plurality of NOR gates, each of the plurality of means for ANDing the at least one output with a signal to route a decoded address signal to a predetermined line of storage cells within the memory array.

2. The circuit of claim 1 wherein the OR and NOR gates each comprise a plurality of field effect transistors.

3. A digital memory array address predecoder in combination with a decoder, comprising: at least one logic gate for predecoding first address signals and having at least a first and a second field effect transistor to receive the first address signals, and having a third transistor for precharging an output node of the at least one logic gate; at least a second logic gate having an input coupled to the output node of the at least one logic gate, the at least a second logic gate having at least a fourth field effect transistor for receiving other predecoded address signals, the at least a second logic gate having an output; and a last field effect transistor having a first electrode, a second electrode, and a gate electrode wherein the gate electrode is coupled to the output of the at least a second logic gate, the first electrode of the last field effect transistor being coupled to an address array line select signal, and the second electrode of the last field effect transistor being coupled to the memory array.

4. A digital memory array address predecoder in combination with a decoder, comprising: at least one logic gate for predecoding first address signals and having at least a first and a second field effect transistor to receive the first address signals, and having a third transistor for precharging an output node of the at least one logic gate; at least a second logic gate having an input coupled to the output node of the at least one logic gate, the at least a second logic gate having at least a fourth field effect transistor for receiving other predecoded address signals, the at least a second logic gate having an output; and a last field effect transistor having a first electrode, a second electrode, and a gate electrode wherein the gate electrode is coupled to the output of the at least a second logic gate, the first electrode of the last field effect transistor being coupled to an address array line select signal, and the second electrode of the last field effect transistor being coupled to the memory array, the at least one logic gate is an OR gate, the at least a second logic gate is a NOR gate, and the last field effect transistor performs a logic AND function.

5. A digital decoding system for decoding multi-bit parallel channel digital input signals, comprising: a plurality of logic OR gates for receiving and predecoding the digital input signals and each providing an output; and a plurality of logic NOR gates each coupled to a respective one of the plurality logic OR gates for receiving the output of each respective one of the plurality of logic OR gates; and a plurality of gated output circuits each coupled to a respective one of the plurality of logic NOR gates for passing decoded outputs upon predetermined commands.

6. A digital decoding system for decoding multi-bit parallel channel digital input signals and having a predecoder, comprising: a first plurality of logic gates each having a first, a second, and a third transistor, each transistor having a first, a second, and a gate electrode, the first electrodes of the first and second transistors being coupled to a first power supply terminal and the second electrodes of the first and second transistors being connected together to form an output node, the first electrode of the third transistor being coupled to the output node, the gate electrode of the third transistor being for receiving a precharge signal, and the gate electrodes of the first and second transistors being for receiving coded digital input signals; and a second plurality of logic gates each having a fourth transistor with a first, a second, and a gate electrode, the gate electrode of the fourth transistor being for receiving the precharge signal and the first electrode being coupled to the first power supply terminal, a fifth transistor having a first, a second, and a gate electrode which is coupled to the output node of a logic gate from the first plurality of logic gates, the first electrode of the fifth transistor being connected to the second electrode of the fourth transistor, and at least a sixth transistor connected in parallel with the fifth transistor and having a gate electrode coupled to another logic gate of the first plurality of logic gates; and at least one output transistor having a gate electrode coupled to the second electrode of the fourth transistor.

* * * * *